US012651625B2

(12) United States Patent
Woo et al.

(10) Patent No.: US 12,651,625 B2
(45) Date of Patent: Jun. 9, 2026

(54) ROW HAMMER MITIGATION

(71) Applicant: Rambus Inc., San Jose, CA (US)

(72) Inventors: Steven C. Woo, Saratoga, CA (US);
Michael Raymond Miller, Raleigh, NC
(US)

(73) Assignee: Rambus Inc., San Jose, CA (US)

( * ) Notice: Subject to any disclaimer, the term of this
patent is extended or adjusted under 35
U.S.C. 154(b) by 204 days.

(21) Appl. No.: 18/375,810

(22) Filed: Oct. 2, 2023

(65) Prior Publication Data

US 2024/0119989 A1     Apr. 11, 2024

Related U.S. Application Data

(60) Provisional application No. 63/415,152, filed on Oct.
11, 2022.

(51) Int. Cl.
*G11C 11/406*         (2006.01)
*G11C 11/408*         (2006.01)

(52) U.S. Cl.
CPC .. *G11C 11/40618* (2013.01); *G11C 11/40615*
(2013.01); *G11C 11/408* (2013.01)

(58) Field of Classification Search
CPC .............................................. G11C 11/40618
See application file for complete search history.

(56) References Cited

U.S. PATENT DOCUMENTS

| | | | |
|---|---|---|---|
| 9,269,436 B2 | 2/2016 | Mandava et al. | |
| 10,636,476 B2 | 4/2020 | Nale | |
| 10,818,337 B2 | 10/2020 | Kuramori et al. | |
| 11,354,408 B2 | 6/2022 | Ghosh et al. | |
| 2017/0117030 A1 | 4/2017 | Fisch et al. | |
| 2023/0017826 A1* | 1/2023 | Lu ..................... | G11C 11/40603 |
| 2023/0253025 A1* | 8/2023 | Du .................... | G11C 11/40626 |
| | | | 365/222 |
| 2023/0395126 A1* | 12/2023 | Gieske .............. | G11C 11/40618 |

* cited by examiner

*Primary Examiner* — Hoai V Ho
(74) *Attorney, Agent, or Firm* — The Neudeck Law Firm,
LLC

(57)         ABSTRACT

Row hammer is mitigated by issuing, to a memory device,
mitigation operation (MOP) commands in order to cause the
refresh of rows at a specified vicinity of a suspected aggres-
sor row. These mitigation operation commands are each
associated with respective row addresses that indicate the
suspected aggressor row and an indicator of which neighbor
row in the vicinity of the suspected aggressor row is to be
refreshed. The mitigation operation commands are issued in
response to a fixed number of activate commands. The
suspected aggressor row is selected by randomly choosing,
with equal probability, one of the N previous activate
commands to supply its associated row address as the
suspected aggressor row address. The neighbor row may be
selected randomly with a probability that diminishes
inversely with the distance between the suspected aggressor
row and the neighbor row.

20 Claims, 14 Drawing Sheets

100

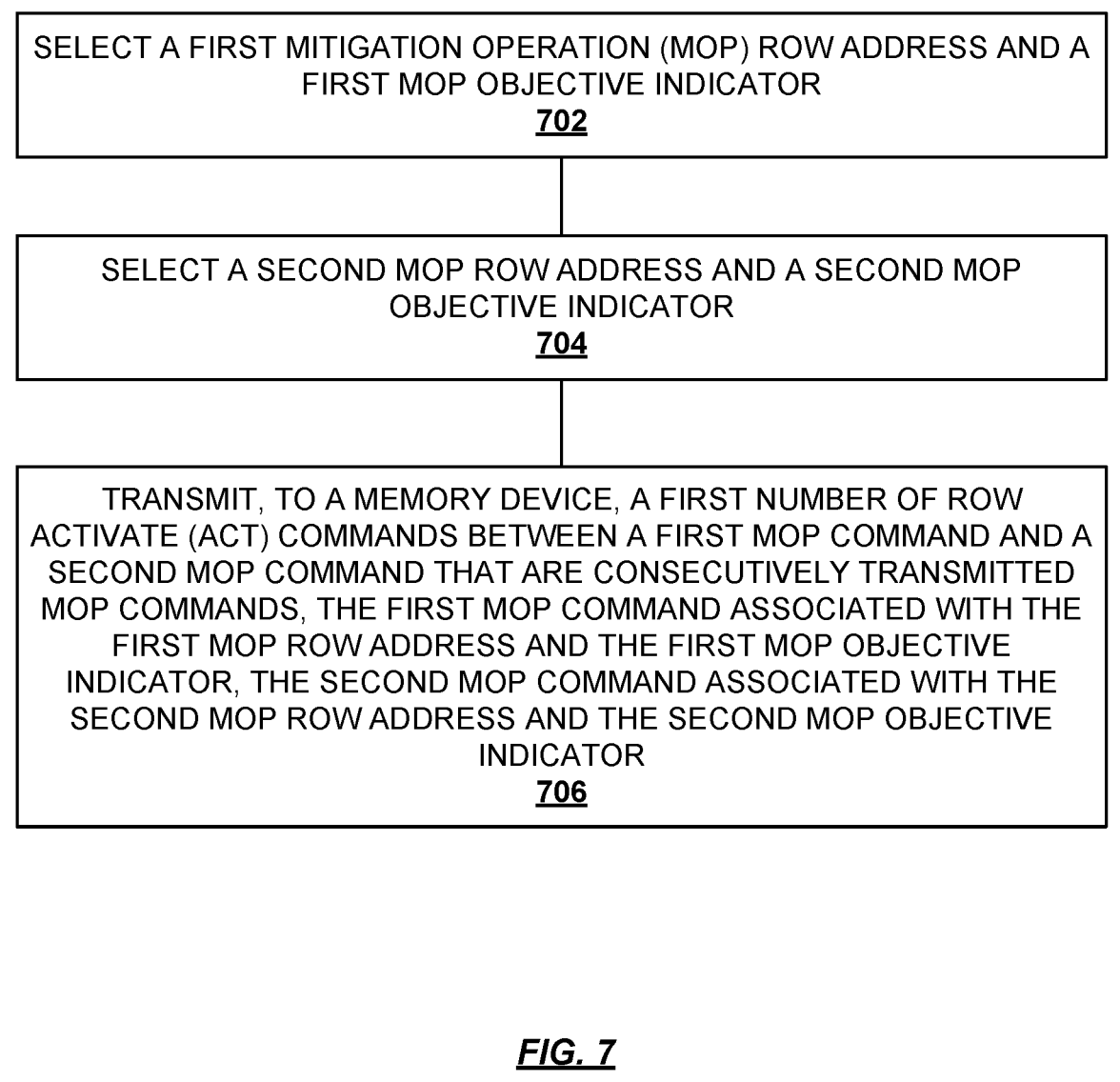

SELECT A FIRST MITIGATION OPERATION (MOP) ROW ADDRESS AND A FIRST MOP OBJECTIVE INDICATOR
702

SELECT A SECOND MOP ROW ADDRESS AND A SECOND MOP OBJECTIVE INDICATOR
704

TRANSMIT, TO A MEMORY DEVICE, A FIRST NUMBER OF ROW ACTIVATE (ACT) COMMANDS BETWEEN A FIRST MOP COMMAND AND A SECOND MOP COMMAND THAT ARE CONSECUTIVELY TRANSMITTED MOP COMMANDS, THE FIRST MOP COMMAND ASSOCIATED WITH THE FIRST MOP ROW ADDRESS AND THE FIRST MOP OBJECTIVE INDICATOR, THE SECOND MOP COMMAND ASSOCIATED WITH THE SECOND MOP ROW ADDRESS AND THE SECOND MOP OBJECTIVE INDICATOR
706

*FIG. 7*

SELECT A ROW ADDRESS FOR A
MITIGATION OPERATION
802

SELECT A OBJECTIVE FOR THE
MITIGATION OPERATION
804

TRANSMIT, TO A MEMORY DEVICE, A
MITIGATION OPERATION COMMAND IN
ASSOCIATION WITH AN INDICATOR OF
THE SELECTED ROW ADDRESS AND AN
INDICATOR OF THE SELECTED
OBJECTIVE
806

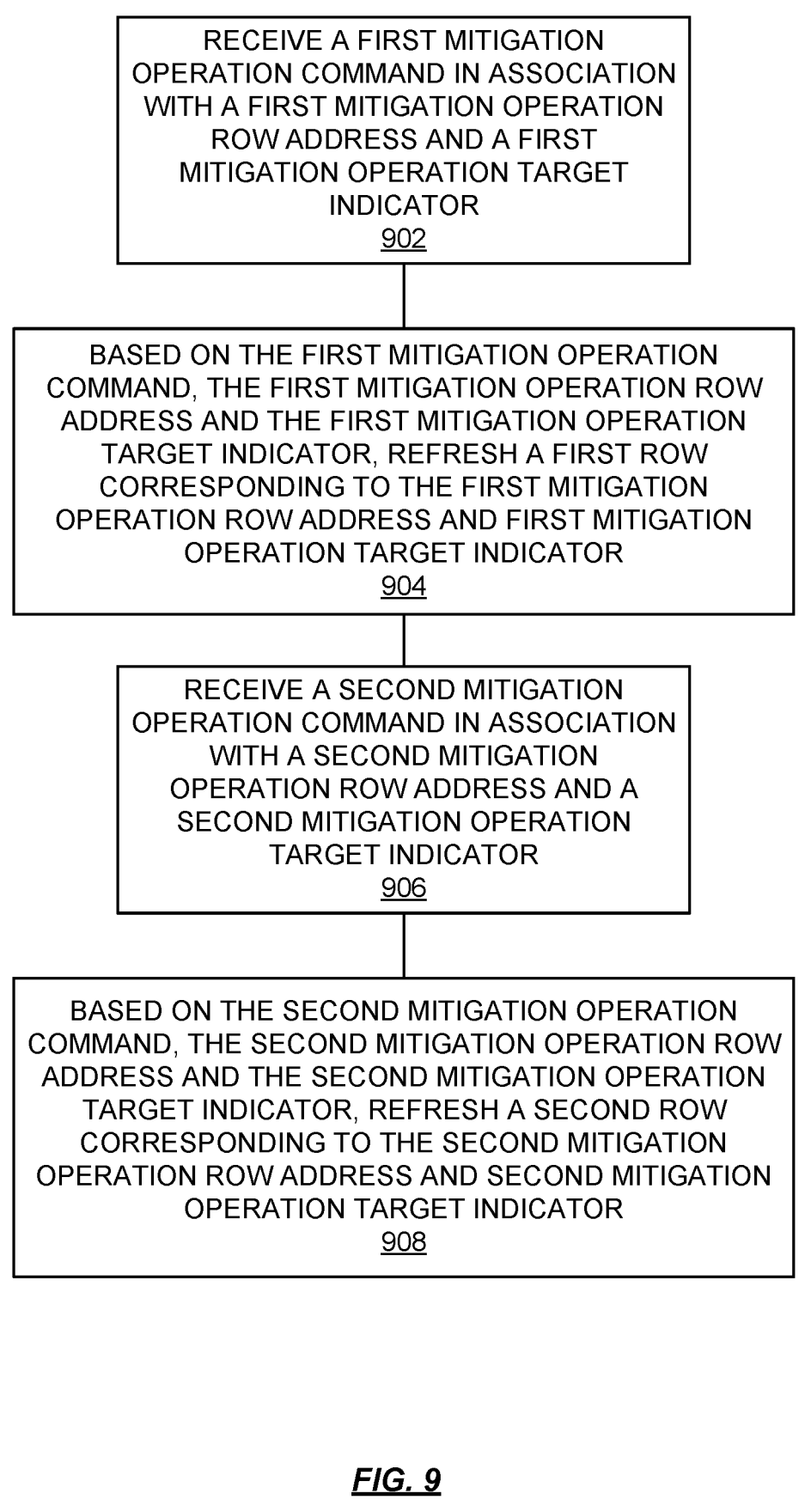

RECEIVE A FIRST MITIGATION
OPERATION COMMAND IN ASSOCIATION
WITH A FIRST MITIGATION OPERATION
ROW ADDRESS AND A FIRST
MITIGATION OPERATION TARGET
INDICATOR
902

BASED ON THE FIRST MITIGATION OPERATION
COMMAND, THE FIRST MITIGATION OPERATION ROW
ADDRESS AND THE FIRST MITIGATION OPERATION
TARGET INDICATOR, REFRESH A FIRST ROW
CORRESPONDING TO THE FIRST MITIGATION
OPERATION ROW ADDRESS AND FIRST MITIGATION
OPERATION TARGET INDICATOR
904

RECEIVE A SECOND MITIGATION
OPERATION COMMAND IN ASSOCIATION
WITH A SECOND MITIGATION
OPERATION ROW ADDRESS AND A
SECOND MITIGATION OPERATION
TARGET INDICATOR
906

BASED ON THE SECOND MITIGATION OPERATION
COMMAND, THE SECOND MITIGATION OPERATION ROW
ADDRESS AND THE SECOND MITIGATION OPERATION
TARGET INDICATOR, REFRESH A SECOND ROW
CORRESPONDING TO THE SECOND MITIGATION
OPERATION ROW ADDRESS AND SECOND MITIGATION
OPERATION TARGET INDICATOR
908

*FIG. 9*

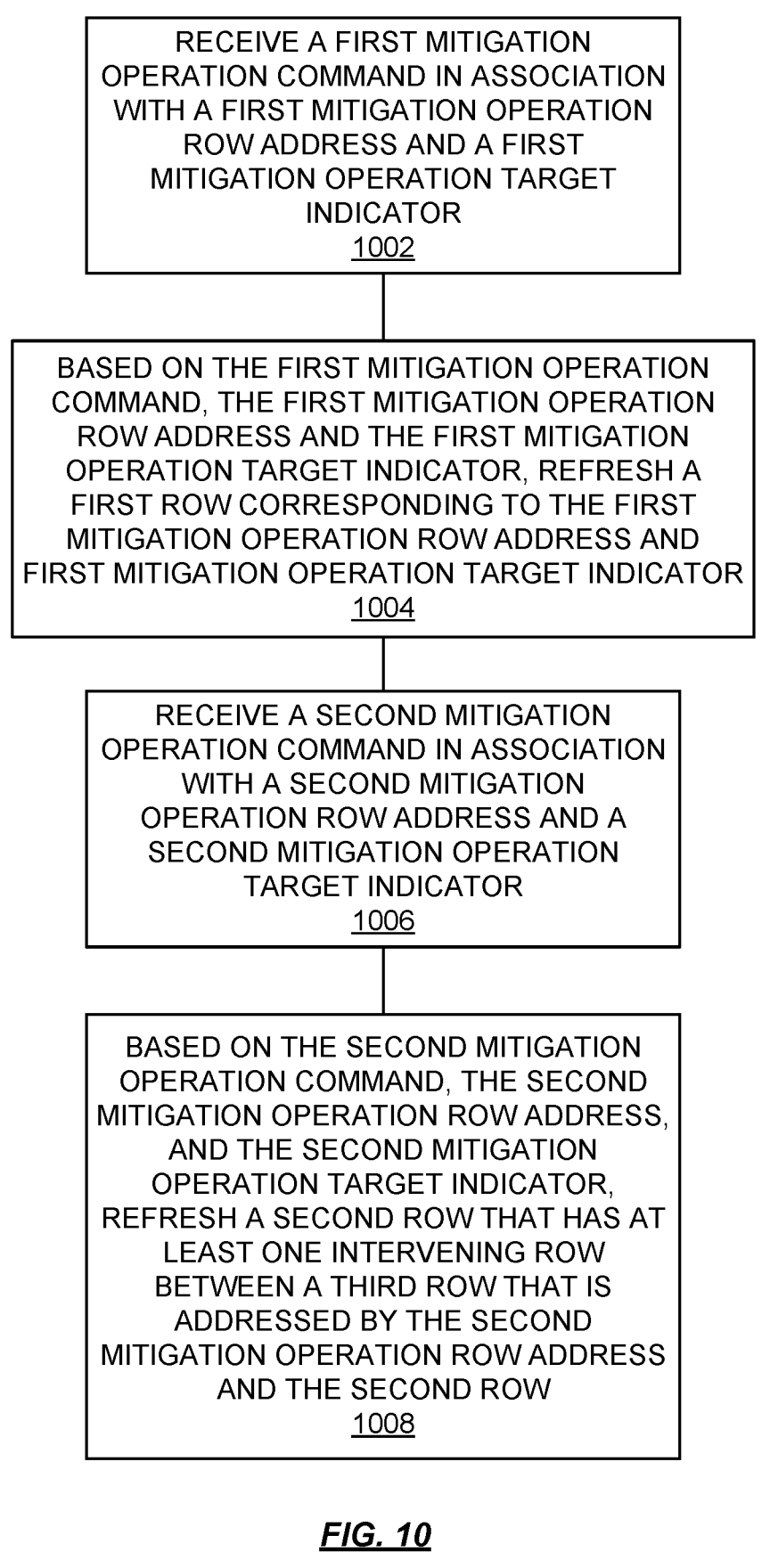

RECEIVE A FIRST MITIGATION
OPERATION COMMAND IN ASSOCIATION
WITH A FIRST MITIGATION OPERATION
ROW ADDRESS AND A FIRST
MITIGATION OPERATION TARGET
INDICATOR
1002

BASED ON THE FIRST MITIGATION OPERATION
COMMAND, THE FIRST MITIGATION OPERATION
ROW ADDRESS AND THE FIRST MITIGATION
OPERATION TARGET INDICATOR, REFRESH A
FIRST ROW CORRESPONDING TO THE FIRST
MITIGATION OPERATION ROW ADDRESS AND
FIRST MITIGATION OPERATION TARGET INDICATOR
1004

RECEIVE A SECOND MITIGATION
OPERATION COMMAND IN ASSOCIATION
WITH A SECOND MITIGATION
OPERATION ROW ADDRESS AND A
SECOND MITIGATION OPERATION
TARGET INDICATOR
1006

BASED ON THE SECOND MITIGATION
OPERATION COMMAND, THE SECOND
MITIGATION OPERATION ROW ADDRESS,
AND THE SECOND MITIGATION
OPERATION TARGET INDICATOR,
REFRESH A SECOND ROW THAT HAS AT
LEAST ONE INTERVENING ROW
BETWEEN A THIRD ROW THAT IS
ADDRESSED BY THE SECOND
MITIGATION OPERATION ROW ADDRESS
AND THE SECOND ROW
1008

*FIG. 10*

ROW HAMMER MITIGATION

BRIEF DESCRIPTION OF THE DRAWINGS

FIG. 7 is a flowchart illustrating a method of mitigating row hammer.

FIG. 9 is a flowchart illustrating a method of operating a memory device.

FIG. 10 is a flowchart illustrating a method of responding to row hammer mitigation commands.

DETAILED DESCRIPTION OF THE EMBODIMENTS

Figure 1:
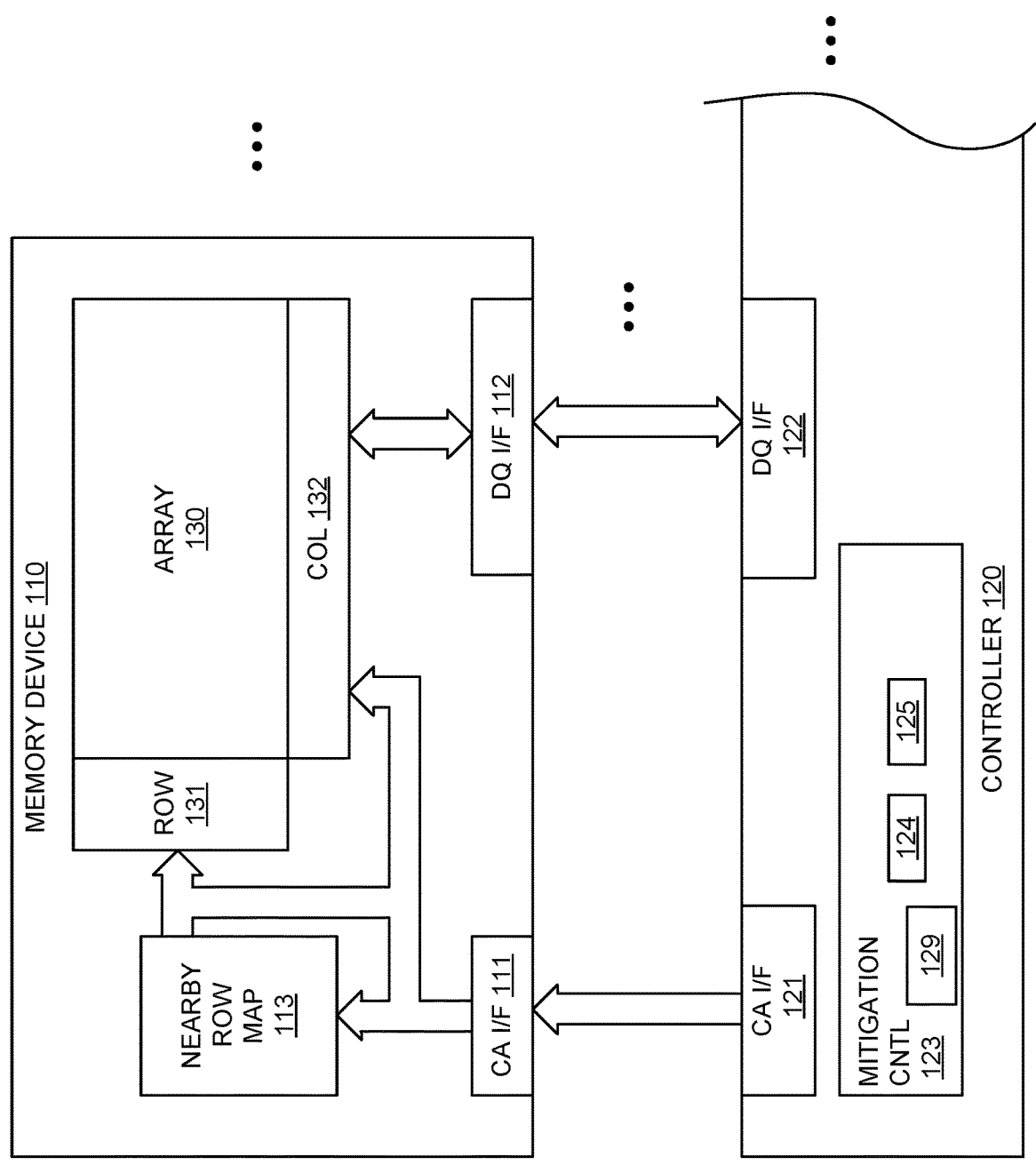
FIG. 1 is a block diagram illustrating a memory system.

Repeated row activations and/or refreshes of the same row (a.k.a., "aggressor row") in a dynamic random access memory (DRAM) device (whether malicious or accidental) can cause cells of rows (a.k.a., "victim rows") in the neighborhood of the aggressor row to lose a stored value. This effect on DRAM storage reliability has been termed "row hammer." Row hammer, when applied to the multiple, parallel, DRAM device accesses that may occur with memory modules, can cause multiple errors across multiple DRAM devices on the module that are possibly uncorrectable and/or undetectable.

In an embodiment, mitigation operation (MOP) commands are issued to a memory device in order to cause the refresh of rows within a specified vicinity of a suspected aggressor row. These mitigation operation commands are each associated with respective row addresses that indicate the suspected aggressor row and an indicator of which neighbor row in the vicinity of the suspected aggressor row is to be refreshed in order to mitigate the likelihood of data being corrupted by "row hammer."

In an embodiment, the mitigation operation commands are issued in response to a fixed number of activate commands. For example, issuing a mitigation operation command for every N (e.g., N=32) activate commands. The suspected aggressor row is selected by randomly choosing, with equal probability, one of the N previous activate commands to supply its associated row address as the suspected aggressor row address. In other words, each of the previous N activate commands has a probability of $1/N$ of being selected to supply the suspected aggressor row address. In addition, which row in the neighborhood of the suspected aggressor row that is to be refreshed is selected probabilistically. For example, if two levels of victim rows are to be refreshed (i.e., the "victim" rows are the immediate neighbor row and the next row out from the immediate neighbor), the immediate neighbor row may be refreshed with a probability of $(N-1)/N$ and the next row out from the immediate neighbor refreshed with a probability of $1/N$.

The descriptions and embodiments disclosed herein may be made with references to DRAM devices and DRAM memory arrays. This, however, should be understood to be a first example where, due at least to the widespread adoption of DRAM technology, "row-hammer" has been observed and studied. It should be understood that other memory technologies may be susceptible to "row-hammer" and therefore may also benefit from the methods and/or apparatus described herein. These memory technologies include, but are not limited to static random access memory (SRAM), non-volatile memory (such as flash), conductive bridging random access memory (CBRAM—a.k.a., programmable metallization cell—PMC), resistive random access memory (a.k.a., RRAM or ReRAM), magnetoresistive random-access memory (MRAM), Spin-Torque Transfer (STT-MRAM), phase change memory (PCM), and the like, and/or combinations thereof. Accordingly, it should be understood that in the disclosures and/or descriptions given herein, these aforementioned technologies may be substituted for, included with, and/or encompassed within, the references to DRAM, DRAM devices, and/or DRAM arrays made herein.

FIG. 1 is a block diagram illustrating a memory system. In FIG. 1, memory system 100 comprises memory device 110 and memory controller 120. Memory device 110 includes command/address (CA) interface 111, data (DQ) interface 112, row map 113, memory array 130, row circuitry 131, and column circuitry 132. Memory controller 120 includes CA interface 121, DQ interface 122, and mitigation control 123. Mitigation control 123 includes configuration information 129, random number generator 124, and selected address register 125.

Memory controller 120 and memory device 110 may be integrated circuit type devices, such as are commonly referred to as "chips". A memory controller, such as memory controller 120, manages the flow of data going to and from memory devices and/or memory modules. Memory device 110 may be a standalone device, or may be a component of a memory module such as a DIMM module used in servers. Memory device 110 may be a device that adheres to, or is compatible with, a dynamic random access memory (DRAM) specification. A memory controller can be a separate, standalone chip, or integrated into another chip. For example, a memory controller 120 may be included on a single die with a microprocessor, included as a chip co-packaged with one or more microprocessor chips, included as part of a more complex integrated circuit system such as a block of a system on a chip (SOC), or be remotely coupled to one or more microprocessors via a fabric interconnect or other type of interconnect.

CA interface 121 of memory controller 120 is operatively coupled to CA interface 111 of memory device 110. CA interface 121 is operatively coupled to CA interface 111 to communicate commands and addresses (e.g., row and column addresses) from memory controller 120 to memory device 110. In an embodiment, the commands communicated from memory controller 120 to memory device 110 include activate (ACT) commands with an associated external row address, and mitigation operation (MOP) commands with an associated external row address (a.k.a., "suspected aggressor row") and an objective indicator (a.k.a., "victim level" and/or "victim level indicator"). The objective indicator indicates, to memory device 110, which neighboring rows (e.g., immediate neighbor-a.k.a., victim level 1, 1 row intervening-a.k.a., victim level 2, 2 rows intervening-a.k.a., victim level 3, etc.) to the row indicated by the external row address are to be refreshed. Note that most rows (i.e., those not near the top or bottom of memory array 130) will have two immediate neighbors (one above and one below), two rows with one row intervening, (one above and one below) and so on that are to be refreshed in response to a given MOP command.

Figure 2:
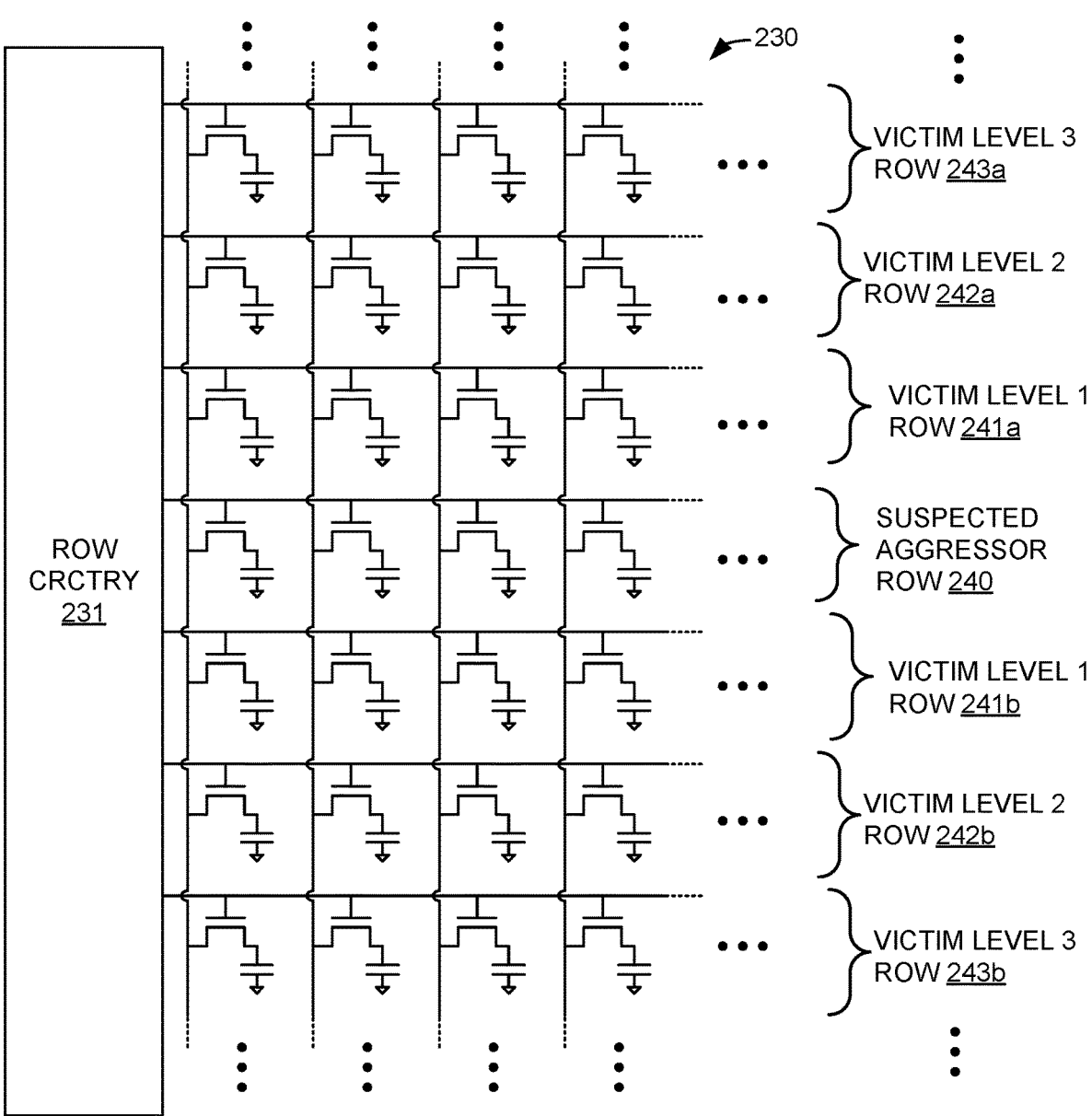
FIG. 2 is a diagram illustrating the relationship between a suspected aggressor row and victim row levels.

FIG. 2 is a diagram illustrating the relationship between an aggressor row and victim row levels. In FIG. 2, row circuitry 231 (e.g., row circuitry 131) and a partial DRAM array 230 (e.g., array 130) are illustrated. The rows of array 230 are illustrated running from left to right with rows being adjacent to each other in the up and down directions. A suspected aggressor row 240 is illustrated near the middle of array. Immediately adjacent to suspected aggressor row 240 (i.e., without any intervening rows) are victim level 1 rows 241a-241b (one above and one below, respectively).

Immediately above victim level 1 row 241a is victim level 2 row 242a. Likewise, immediately below victim level 1 row 241b is victim level 2 row 242b. Thus, it should be noted that each victim level 2 row 242a-242b has one intervening row (level 1 rows 241a-241b, respectively) between themselves and suspected aggressor row 240. Immediately above victim level 2 row 242a is victim level 3 row 243a. Likewise, immediately below victim level 2 row 242b is victim level 3 row 243b. Thus, it should be noted that each victim level 3 row 243a-243b have two intervening rows between themselves and suspected aggressor row 240, and so on for additional victim levels (e.g., level 4, level 5, etc.).

Returning now to FIG. 1, memory controller 120 is operatively coupled to memory device 110 via DQ interface 122 and DQ interface 112. Memory controller 120 and memory device 110 are operatively coupled via DQ interface 122 and DQ interface 112 to bidirectionally communicate data. Memory device 110 may store (e.g., in memory array 130) and retrieve (e.g., from memory array 130) data communicated via DQ interface 122 and DQ interface 112.

CA interface 111 of memory device 110 is operatively coupled to memory array 130. Row addresses received via CA interface 111 (a.k.a., external row addresses) in association with activate (ACT) commands are operatively coupled to memory array 130 via row circuitry 131 (e.g., row address decoders, buffers, etc.) Row addresses received via CA interface 111 (a.k.a., external row addresses) in association with mitigation operation (MOP) commands are operatively coupled to row map 113. Row map 113 uses row addresses and objective indicators received in association with MOP commands to determine which row or rows adjacent to, or in the vicinity of, the row addressed by the MOP command are to be refreshed in response to the MOP command. The row addresses to be refreshed are operatively coupled to row circuitry 131 (e.g., row address decoders, buffers, etc.) Column addresses received via CA interface 111 are operatively coupled to memory array 130 via column circuitry 132 (e.g., column address decoders, buffers, etc.).

Mitigation control 123 of memory controller 120 determines when and how often (e.g., number of intervening ACT commands between MOP commands) to transmit MOP commands to memory device 110 via CA interface 121 and CA interface 111. For example, based on configuration information 129 (e.g., information received from memory device 110, mode, operating mode, programmed register value, programmed fuses, etc.), mitigation control 123 issues refresh management commands to memory device 110. In an embodiment, memory controller 120 transmits MOP commands, associated row addresses, and objective indicators to memory device 110 using a fixed (e.g., configured) number of activate commands between consecutive pairs of MOP commands. In another embodiment, memory controller 120 transmits MOP commands, associated row addresses, and objective indicators to memory device 110 using varying numbers of activate commands between consecutive pairs of MOP commands. In an embodiment, as described herein, the one or more row addresses provided in association with ACT command(s) between MOP commands may be randomly selected based on output from random number generator 124. These stored row addresses may be provided to memory device 110 by memory controller 120 in association with a MOP command. Memory device 110 (and row map 113, in particular) may use these received row addresses and associated objective indicators to determine which rows adjacent to, or in the vicinity of, the received row addresses that are to be refreshed in response to the corresponding MOP command.

In some embodiments, memory controller 120 may alternate between two numbers of intervening activate commands between consecutive MOP commands. For example, based on configuration information 129, memory controller 120 may transmit a first MOP command, wait for N number (and/or approximately N number) of activate commands to be transmitted, issue a second MOP command, wait for M number (and/or approximately M number) of activate commands to be transmitted (where N≠M), then issue a third MOP command, again wait for N number (and/or approximately N number) of activate commands to be transmitted, issue a fourth MOP command, and so forth. In some embodiments, based on configuration information 129, memory controller 120 may rotate between more than two numbers of intervening activate commands between consecutive MOP commands. For example, memory controller 120 may rotate among transmitting N, M, and P numbers (and/or approximately N, M, and/or P numbers) of activate commands, where N≠M≠P.

When mitigation control 123 is to transmit a mitigation operation command (e.g., in response to a threshold number of ACT commands having been sent since the last MOP command), mitigation control 123 of memory controller 120 selects at least one row address and an objective indicator to send in association with the MOP command. In an embodiment, mitigation control 123 selects the suspected aggressor row (SAR) indicator based on a row transmitted with (e.g., specified by) a probabilistically selected previously transmitted activate command. For example, mitigation control 123 may select the row address that was transmitted with the $R^{th}$ activate command after the last MOP command was transmitted where R was selected based on the total number of ACT commands (e.g., N=32) between MOP commands and a number from random number generator 124 where the probability of any given ACT command being selected to supply the SAR address is one divided by the total number of ACT commands between MOP commands (e.g., 1/N or 1/32 for N=32). The address of this row (i.e., address transmitted with the ACT command) may be stored in selected address register 125. In some embodiments, one or more other pseudo random algorithmic techniques may be employed (e.g., linear feedback shift register, etc.) to select the activate command that determines the address of a row to be transmitted in association with a given MOP command.

As discussed herein, mitigation control 123 may randomly select, or use a randomized selection technique (e.g., pseudo-random number generator) to select the activate command that determines the address of a row to be sent in association with a MOP command. Likewise, mitigation control 123 may randomly select, or use a randomized selection technique for the objective indicator. For example, for each level of a range of victim rows (e.g., victim levels 1-3), the probability of the current level being selected may be $(N-1)/N$. If the current level is not selected (which has a probability of $1/N$), the next farther out level is selected and the probability of the new current level being selected may be $(N-1)/N$, and so on. Thus, for a range of victim levels from one (1) to three (3), this iterative random selection process results in a probability of victim level 1 being selected of $(N-1)/N$; the probability of victim level 2 being selected is $(N-1)/N^2$; and the probability of victim level 3 being is selected of $1/N^2$. Note that these probabilities sum to one (1) and that this process may be extended to other ranges of victim levels (e.g., levels1-4, levels 1-5, etc.).

To illustrate, consider a configuration where the objective indicator is to indicate whether victim level 1 rows or victim level 2 rows are to be refreshed. In this example, the probability that the adjacent rows will be selected is configured to be $(N-1)/N$ where N is the number of ACT commands between MOP commands. Thus, the probability that the victim level 1 rows will be selected is $(N-1)/N$ and the probability that the victim level 2 rows will be selected is $1/N$. In another example, the probability that the adjacent rows will be selected may be configured to be based on a victim level 2 probability that is not $1/N$. For example, the probability that the victim level 1 rows will be selected is $(N-X)/N$ and the probability that the victim level 2 rows will be selected is $X/N$, where X may be configured to be other numbers such as ½, 2, 3, 4, and so on.

To further illustrate, consider a configuration where the objective indicator is to indicate which of three levels of potential victim rows are to be refreshed. Once a SAR is selected, a first random number from random number generator 124 is used to determine whether the victim level 1 rows are to be selected by the first random number and refreshed by the MOP command with a probability of $(N-1)/N$. The probability that a second random number is needed, is thus $1/N$. If it is determined that a second random number is needed, a second random number from random number generator 124 is used to determine whether the victim level 2 rows are to be selected by the second random number and refreshed by the MOP command with a probability of $(N-1)/N$. The probability that the victim level 3 rows are to be selected by this second random number and refreshed by the MOP command is thus $1/N$. In another example, the probability that the victim level 1 rows will be selected by the first random number may be configured to be based on a victim level 3 probability that is not $1/N$. For example, X/N where X may be configured to be other numbers such as ½, 2, 3, 4, and so on.

In an embodiment, mitigation control 123 may maintain a history list (or buffer) of recently selected row addresses (e.g., first-in first-out). The currently selected row addresses may be compared to the entries in this list to determine whether the currently selected row address has been recently selected for a different MOP command (e.g., current address appears in the list). If there is a match between the currently selected row address and an entry in the list, a new row address (preferably one not in the list) may be selected. In another embodiment, if there is a match between the currently selected row address and an entry in the list, a victim level that does not match the victim level of the previous MOP command with the matching address may be selected.

In another embodiment, when the selected address matches an address in the list, the MOP command may be skipped.

In an embodiment, memory controller 120 transmits, via CA interface 121 row activate (ACT) commands and mitigation operation (MOP) commands to a memory device 110. Memory device 110 receives these ACT and MOP commands via CA interface 111. Mitigation control 123, based on configuration information 129, determines a first number (N) of row activate commands to be transmitted between a first MOP command and a second MOP command. For example, based on configuration information 129, mitigation control 123 may configure memory controller 120 to transmit a first MOP command, followed by N number of ACT commands each associated with a respective row address. After the N number (and/or approximately N number) of ACT commands are transmitted, memory controller 120 is configured to transmit a second MOP command. Mitigation control 123 also, based on configuration information 129, determines a second number (M) of row activate commands to be transmitted between the second MOP command and a third MOP command. For example, based on configuration information 129, mitigation control 123 may configure memory controller 120 to transmit the second MOP command, followed by M number of ACT commands each associated with a respective row address. After the M number of ACT commands (and/or approximately M number) are transmitted, memory controller 120 is configured to transmit a third MOP command. Memory controller 120 may be configured to, after transmitting the third MOP command, transmit another N number of ACT commands, followed by a MOP command, then followed by M number of ACT commands, followed by another MOP command, and so on, alternating between sets of N and M ACT commands between MOP commands.

In an embodiment, memory controller 120 receives, from the memory device 110, an indicator associated with an average number of ACT commands to be transmitted between successive MOP commands. Thus, one of N and M may be greater than the average number of ACT commands to be transmitted between successive MOP commands and the other of N and M may be less than the average. In an embodiment, the average of N and M may be less than, equal to, or greater than the average number of ACT commands to be transmitted between successive MOP commands.

In an embodiment, memory controller 120 (and mitigation control 123, in particular) randomly or pseudo-randomly selects a first row address from the N number of row addresses transmitted in association with the ACT commands transmitted by memory controller 120 between the first MOP command and the second MOP command. When the conditions for transmitting a second MOP command are met, and based on the first row address (e.g., randomly selected and then stored in selected address register 125), memory controller 120 selects a row address (e.g., the first row address) and objective indicator (e.g., victim level 1, victim level 2, etc.) to be transmitted in association with the MOP command. This selected row address and objective indicator may be translated by row map 113 in memory device 110 into row addresses of one or more rows at the specified victim level (i.e., rows from) in relation to the selected first row address. The row(s) at the specified victim level are to be refreshed in response to the second MOP command.

Memory controller 120 (and mitigation control 123, in particular) may also select a second row address from the M number of row addresses transmitted in association with the ACT commands transmitted by memory controller 120 between the second MOP command and the third MOP command. In an embodiment, N is not equal to M. When the conditions to transmit the third MOP command are met, and based on the second row address (e.g., randomly selected and then stored in selected address register 125), memory controller 120 selects a row address and objective indicator to be transmitted in association with the third MOP command (e.g., the second row address.) This selected row address and objective indicator may be translated by row map 113 in memory device 110 into row addresses of one or more rows at the specified victim level (i.e., rows from) in relation to the selected second row address. The row(s) at the specified victim level are to be refreshed in response to the third MOP command.

In an embodiment, memory controller 120 is configured to transmit, via CA interface 121, N number of row activate (ACT) commands between a first pair of MOP commands. Memory controller 120 is also configured to transmit, via CA interface 121, M number of ACT commands between a second pair of consecutive MOP commands, where N and M are positive integers that are not equal.

In some embodiments, memory controller 120 may also transmit, via CA interface 121, P number of row activate (ACT) commands between a third pair of consecutive MOP commands where P is a positive integer that is not equal to N and is not equal to M.

In some embodiments, memory controller 120 selects a first row address from the N number of row addresses associated with the ACT commands transmitted by memory controller 120 between the first pair of consecutive MOP commands. When the conditions to transmit a MOP command are met (which may or may not be the second MOP command of the first pair), and based on the first row address, memory controller 120 (and mitigation control 123, in particular) randomly selects a row address and randomly selects an objective indicator to be transmitted in association with the second MOP command (e.g., the first row address and a first objective indicator). This selected row address and objective indicator may be translated by row map 113 in memory device 110 into row address(es) of one or more rows at the specified (i.e., by the objective indicator) distance (i.e., victim level) to the selected row address. These one or more rows at the specified victim level are to be refreshed in response to the second MOP command.

Memory controller 120 may also use a randomized selection technique to select a second row address from the M number of row addresses transmitted by memory controller 120 and between the second pair of MOP commands. A second objective indicator may also be randomly selected. This selected row address and objective indicator may be transmitted in association with a third MOP command (e.g., the second row address and second objective indicator). This selected row address and objective indicator may be translated by row map 113 in memory device 110 into row address(es) of one or more rows at the specified (i.e., by the objective indicator) distance (i.e., victim level) to the selected row address. These one or more rows at the specified victim level are to be refreshed in response to the second MOP command.

Figure 3A:
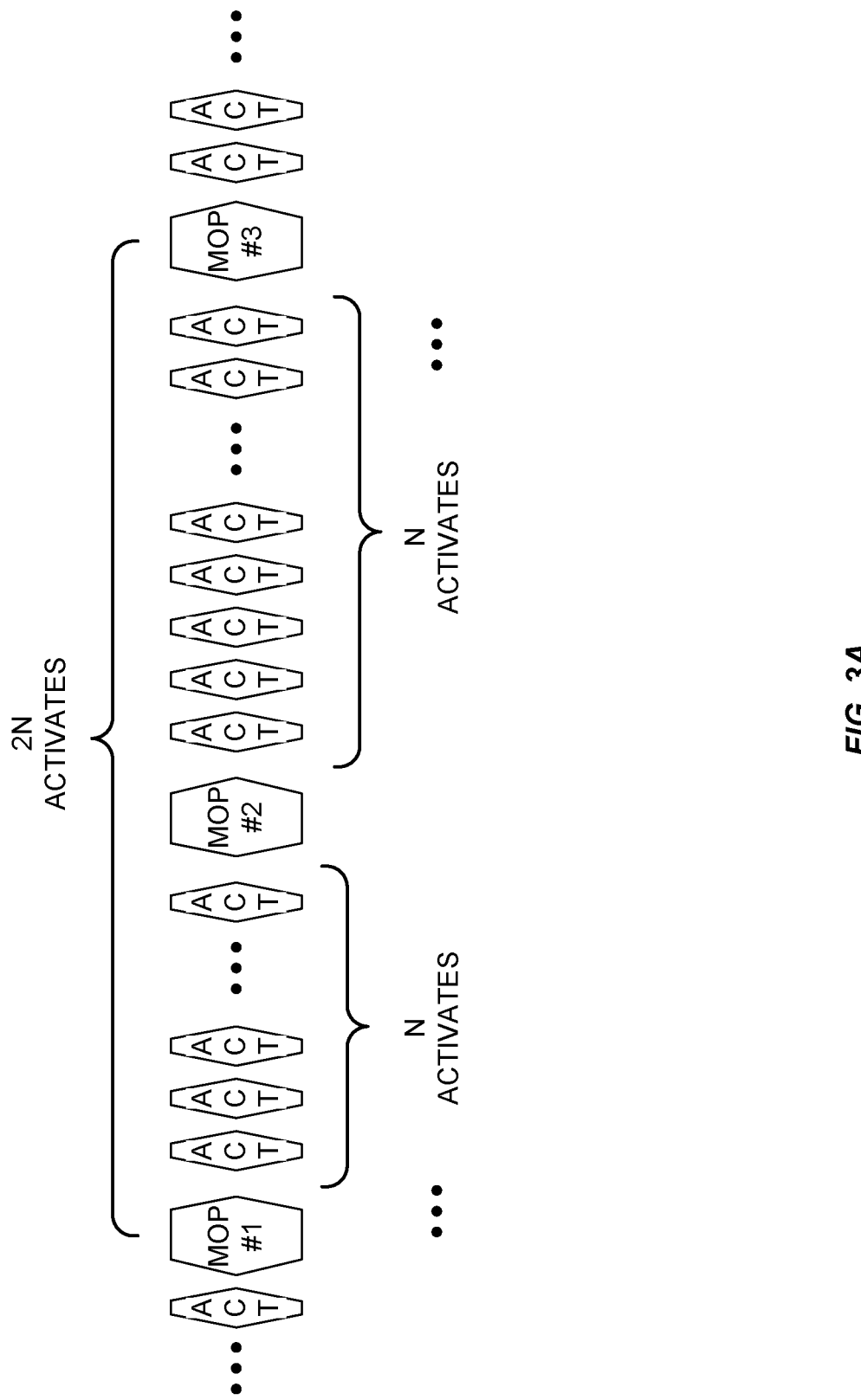
FIGS. 3A-3B are diagrams illustrating a first example for row hammer mitigation operation row selection and occurrence.
Figure 3B:
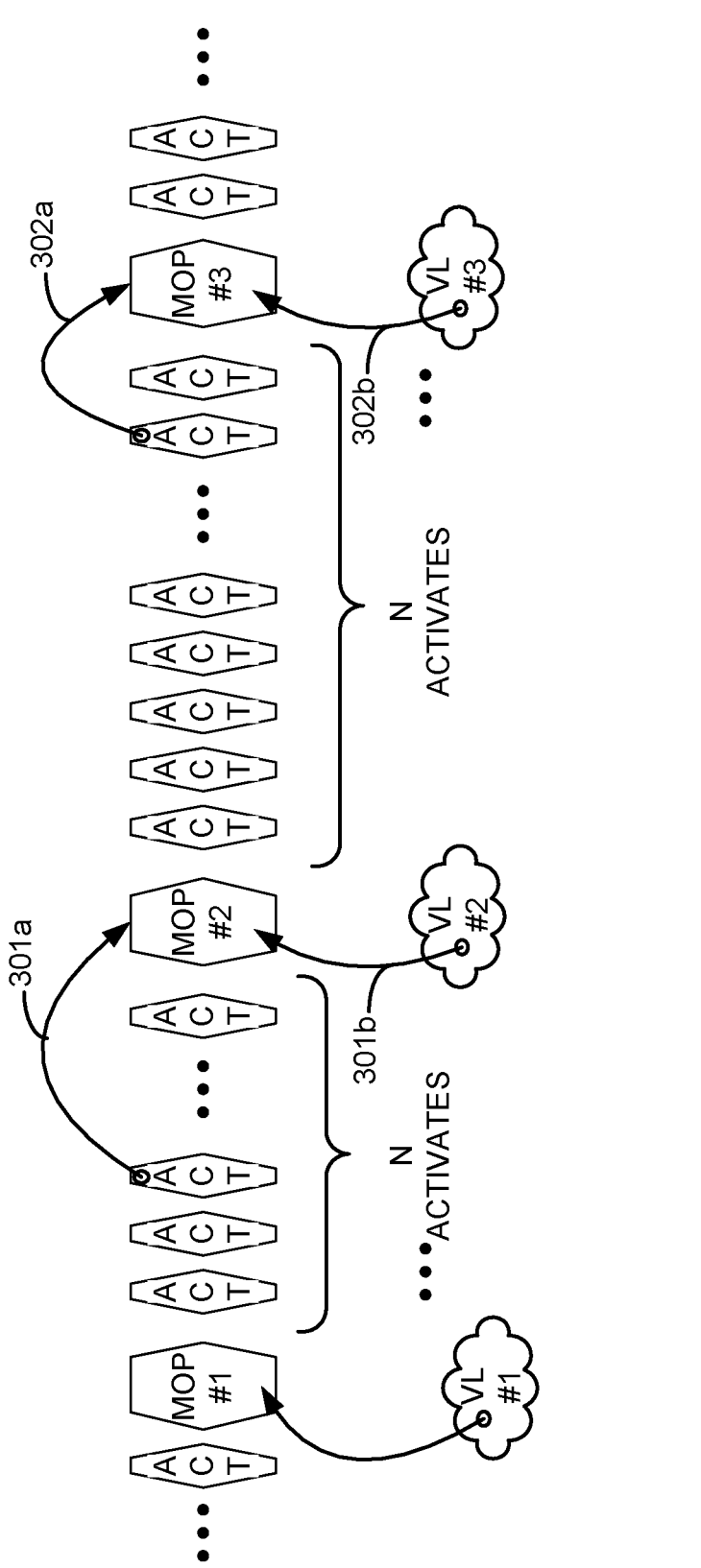

FIGS. 3A-3B are diagrams illustrating a first example for row hammer mitigation operation row selection and occurrence. In FIGS. 3A-3B, a first mitigation operation command (MOP #1) is illustrated being issued (e.g., by controller 120). MOP #1 is followed by N number of row activate (ACT) commands being issued. Following the N number of activates, a second mitigation operation command (MOP #2) is illustrated being issued. MOP #2 is also followed by N number of ACT commands being issued. Following the N number of activates, a third mitigation operation command (MOP #3) is illustrated being issued. Thus, the total number of ACT commands issued between MOP #1 and MOP #3 is 2*N.

FIG. 3B illustrates the selection of suspected aggressor rows (SARs) for the MOP commands. In FIG. 3B, a row from the N number of ACT commands preceding MOP #2 is randomly selected, with substantially equal probability among each of the N number of ACT commands, as the SAR for the rows to be refreshed by MOP #2. This is illustrated in FIG. 3B by arrow 301a running from an ACT command of the N number of ACT commands between MOP #1 and MOP #2 to MOP #2. Also randomly selected, as described herein, is a victim level (a.k.a., objective indicator) for MOP #2. This is illustrated in FIG. 3B by arrow 301b running from victim level #2 to MOP #2. For example, victim level 1 may be selected with a probability of P1, victim level 2 with a probability of P2, and so on such that the sum of probabilities for all of the victim levels under consideration equals 1 (i.e., P1+P2+ . . . =1.0). Thus, for example, taking victim levels 1-3 as candidates to be refreshed, the probability that victim level 1 is selected can be $(N-1)/N$; victim level 2 selected $(N-1)/N^2$; and victim level 3 selected $1/N^2$ since $[(N-1)/N]+[(N-1)/N^2]+[1/N^2]=1$.

In FIG. 3B, a row from the N number of ACT commands preceding MOP #3 is randomly selected, with substantially equal probability among each of the N number of ACT commands, as the SAR for the rows to be refreshed by MOP #3. This is illustrated in FIG. 3B by arrow 302a running from an ACT command of the N number of ACT commands between MOP #2 and MOP #3 to MOP #3. Also randomly selected, as described herein, is a victim level (a.k.a., objective indicator) for MOP #3. This is illustrated in FIG. 3B by arrow 302b running from victim level #3 to MOP #3.

Figure 4A:
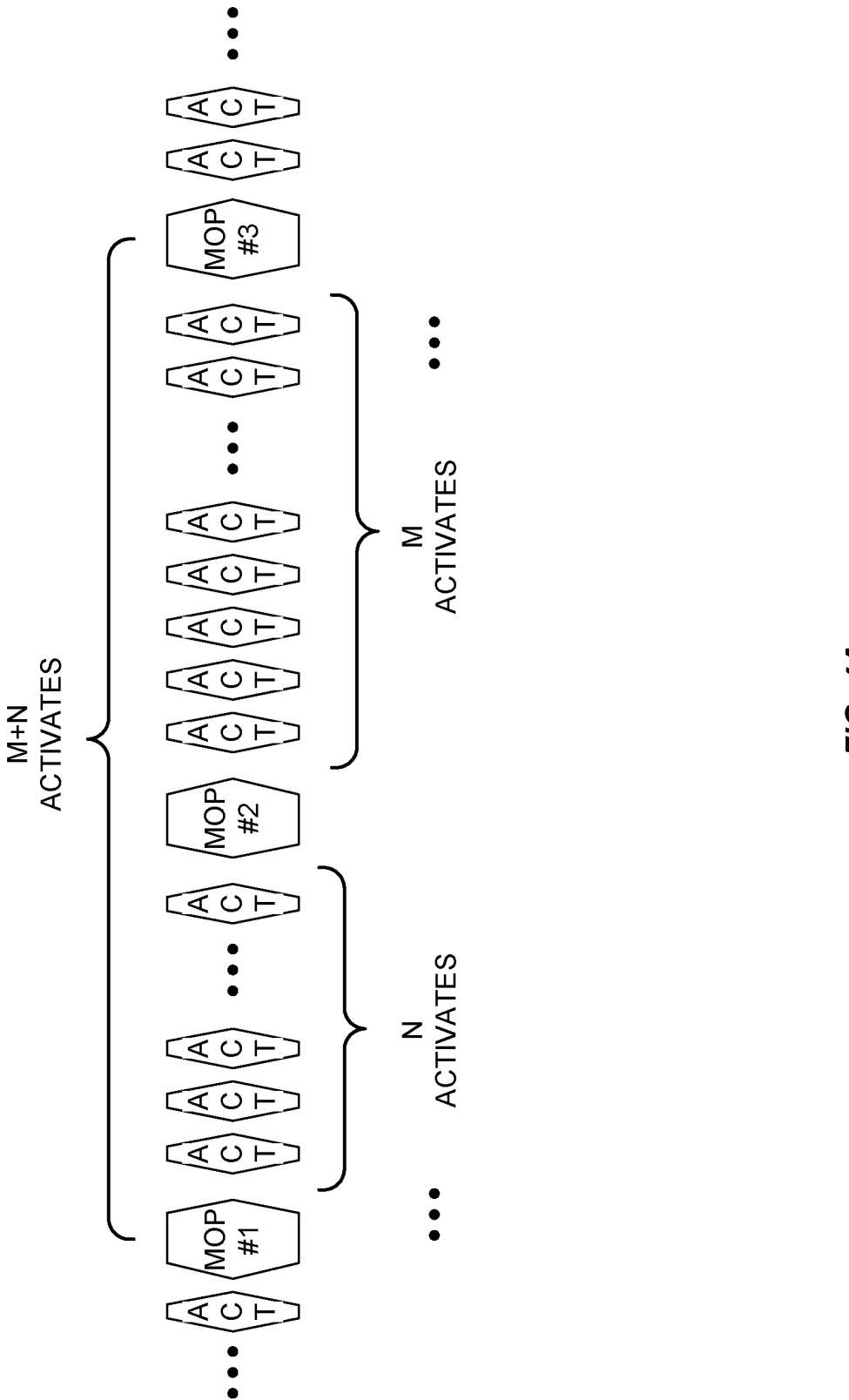
FIGS. 4A-4B are diagrams illustrating a second example for row hammer mitigation operation row selection and occurrence.
Figure 4B:
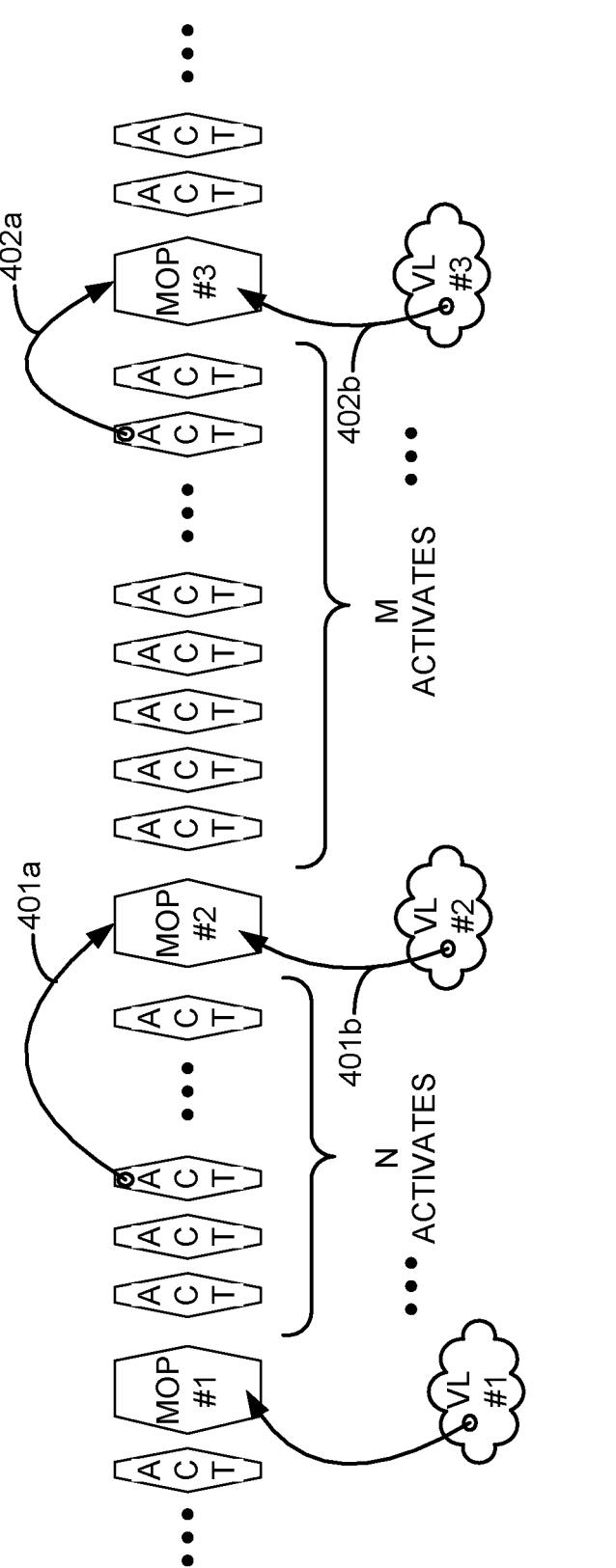

FIGS. 4A-4B are diagrams illustrating a second example for row hammer mitigation operation row selection and occurrence. In FIGS. 4A-4B, a first mitigation operation command (MOP #1) is illustrated being issued (e.g., by controller 120). MOP #1 is followed by N number of row activate (ACT) commands being issued. Following the N number of activates, a second mitigation operation command (MOP #2) is illustrated being issued. MOP #2 is followed by M number of ACT commands being issued. Following the M number of activates, a third mitigation operation command (MOP #3) is illustrated being issued. Thus, the total number of ACT commands issued between MOP #1 and MOP #3 is M+N. It should be understood, therefore, that over the period from the end of MOP #1 to the completion of MOP #3, two MOP commands are performed and M+N ACT commands are performed. That results in an average number of ACT commands per MOP command of Avg=(M+N)/2. In an embodiment, N and M are not equal, but an indicated ratio of MOP to ACT commands is, on average, met. For example, if the average and/or required number of ACT commands per MOP command is indicated as 32, selecting N=61 and M=3 will, on average (i.e., [61+3]/2=32), satisfy the indicated (or required, or configured) ratio of at least one MOP command every 32 ACT commands.

FIG. 4B illustrates the selection of suspected aggressor rows (SARs) for the MOP commands. In FIG. 4B, a row from the N number of ACT commands preceding MOP #2 is randomly selected, with substantially equal probability among each of the N number of ACT commands, as the SAR for the rows to be refreshed by MOP #2. This is illustrated in FIG. 4B by arrow 401a running from an ACT command of the N number of ACT commands between MOP #1 and MOP #2 to MOP #2. Also randomly selected as described herein is a victim level (a.k.a., objective indicator) for MOP #2 (e.g., with probability of (N−1)/N for the first victim level, (N−1)/(N²) for the second victim level, and 1/(N²) for the third victim level when using 3 victim levels). This is illustrated in FIG. 4B by arrow 401b running from victim level #2 to MOP #2. In FIG. 4B, a row from the M number of ACT commands preceding MOP #3 is randomly selected, with substantially equal probability among each of the M number of ACT commands, as the SAR for the rows to be refreshed by MOP #3. This is illustrated in FIG. 4B by arrow 402a running from an ACT command of the M number of ACT commands between MOP #2 and MOP #3 to MOP #3. Also randomly selected as described herein is a victim level (a.k.a., objective indicator) for MOP #3 (e.g., with probability of (M−1)/M for the first victim level, (M−1)/(M²) for the second victim level, and 1/(M²) for the third victim level when using 3 victim levels). This is illustrated in FIG. 4B by arrow 402b running from victim level #3 to MOP #3.

Figure 5A:
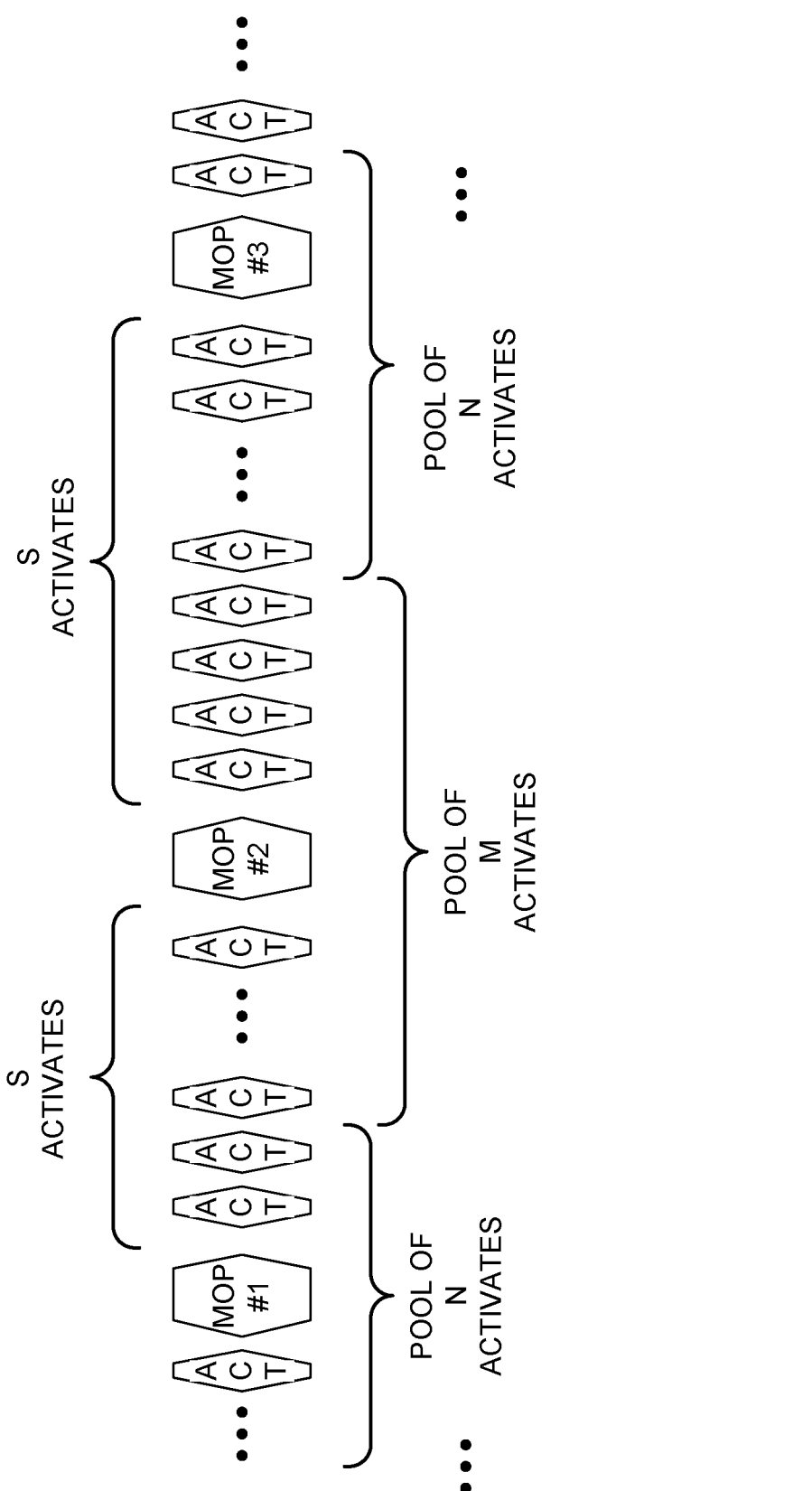
FIGS. 5A-5B are diagrams illustrating a first example of a pool based row selection and mitigation operation occurrence.
Figure 5B:
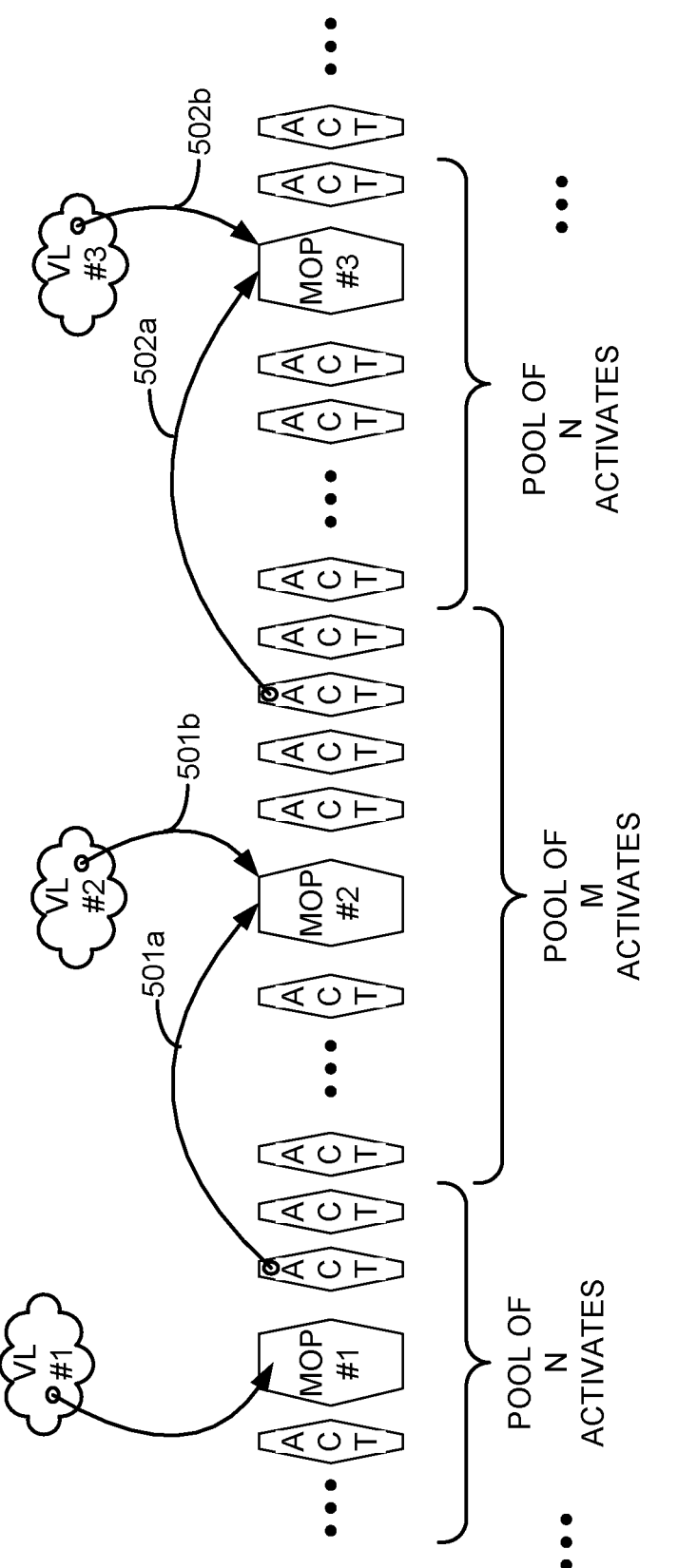

FIGS. 5A-5B are diagrams illustrating a first example of a pool based row selection and mitigation operation occurrence. In FIGS. 5A-5B, a first mitigation operation command (MOP #1) is illustrated being issued (e.g., by controller 120). MOP #1 is followed by S number of row activate (ACT) commands being issued. Following the S number of activates, a second mitigation operation command (MOP #2) is illustrated being issued. MOP #2 is also followed by S number of ACT commands being issued. Following the second S number of activates, a third mitigation operation command (MOP #3) is illustrated being issued. The two sets of S number of activates are divided into two pools with N number of activates and M number of activates, respectively. Thus, the total number of ACT commands issued between MOP #1 and MOP #3 is 2S=M+N. It should be understood, therefore, that between each MOP command, S number of ACT commands are performed. S may be a number that is selected and/or configured to eliminate, reduce, or mitigate the effects of row hammer.

In an embodiment, N and M are not equal. For example, if the number of ACT commands per MOP command is indicated as S=32, selecting N=61 and M=3 will result in two pools that are comprised or composed of the intervening ACT commands between three MOP commands (or two pairs of MOP commands).

FIG. 5B illustrates the selection of suspected aggressor rows (SARs) for the MOP commands. In FIG. 5B, a row from the pool with N number of ACT commands preceding MOP #2 is randomly selected, with substantially equal probability among each of the N number of ACT commands in the pool, as the SAR for the rows to be refreshed by MOP #2. This is illustrated in FIG. 5B by arrow 501a running from an ACT command in the pool with N number of ACT commands to MOP #2. Also randomly selected as described herein is a victim level (a.k.a., objective indicator) for MOP #2 (e.g., with probability of (N−1)/N for the first victim level, (N−1)/(N²) for the second victim level, and 1/(N²) for the third victim level when using 3 victim levels.). This is illustrated in FIG. 5B by arrow 501b running from victim level #2 to MOP #2. In FIG. 5B, a row from the pool with M number of ACT commands preceding MOP #3 is randomly selected, with substantially equal probability among each of the M number of ACT commands in the pool, as the SAR for the rows to be refreshed by MOP #3. This is illustrated in FIG. 5B by arrow 502a running from an ACT command in the pool with M number of ACT commands to MOP #3. Also randomly selected as described herein is a victim level (a.k.a., objective indicator) for MOP #3 (e.g., with probability of (M−1)/M for the first victim level, (M−1)/(M²) for the second victim level, and 1/(M²) for the third victim level when using 3 victim levels). This is illustrated in FIG. 5B by arrow 502b running from victim level #3 to MOP #3.

Figure 6:
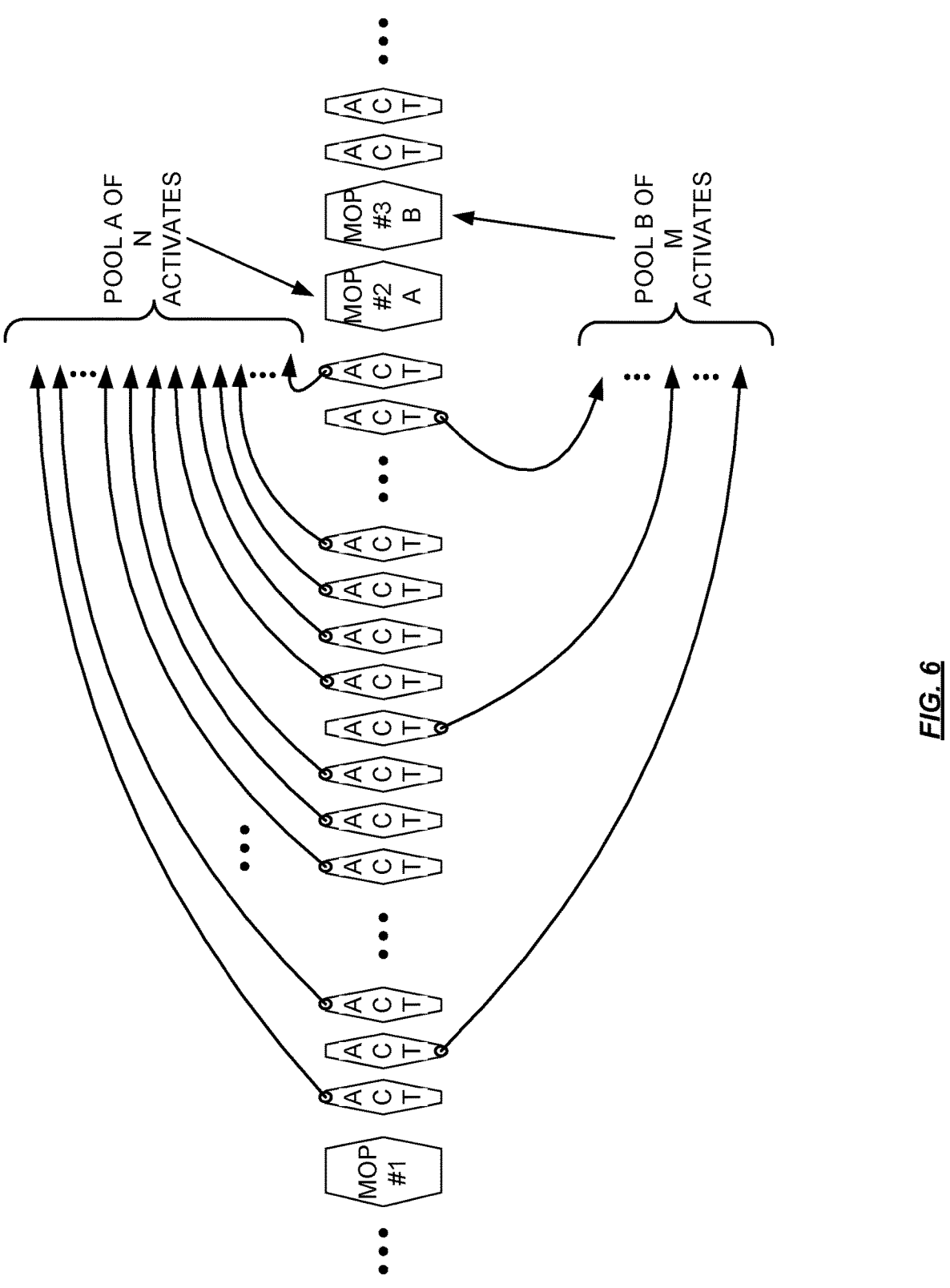
FIG. 6 is a diagram illustrating a second example of a pool based row selection and mitigation operation occurrence.

FIG. 6 is a diagram illustrating a second example of a pool based row selection and mitigation operation occurrence. In FIG. 6, a sequence of row activate commands are assigned to one of two pools (A or B). Once the condition(s) for mitigation operation commands to be issued is met, a first row address (A) is selected from pool A (with N activates) as the SAR for mitigation operation command MOP #2 and a second row address (B) is selected from pool B (with M activates) for mitigation operation command MOP #3. MOP #1, MOP #2, and MOP #3 also have objective indicators (i.e., victim level) for the rows in the vicinity of the respective SAR to be refreshed randomly selected and transmitted in association with the respective MOP command (not shown in FIG. 6). Although FIG. 6 illustrates MOP #2 and MOP #3 without any intervening ACT commands between them, in some embodiments one or more ACT commands may be transmitted between a MOP command address from pool A and a MOP command address from pool B.

FIG. 7 is a flowchart illustrating a method of mitigating row hammer. One or more steps illustrated in FIG. 7 may be performed by, for example, memory system 100, and/or its components. A first mitigation operation (MOP) row address and a first MOP objective indicator are selected (702). For example, controller 120 (and mitigation control 123, in particular) may randomly or pseudo-randomly select, from a pool of activates (e.g., pool of N activates transmitted between two consecutive MOP commands), a first row address associated with one of the activates in the pool and randomly select a first victim level (i.e., number of intervening rows from that row address that is to be refreshed), where the first row address and first victim level is to be transmitted in association with a first MOP command. The random selection of the row may have been made such that each of the pool of activates has a substantially equal (or equal) probability of being selected to provide the row address. Similarly, the random selection of the victim level, may be made such that the probability of selecting victim rows adjacent to the selected row is highest and tapers off inversely with row distance (i.e., number of intervening rows).

A second MOP row address and a second MOP objective indicator are selected (704). For example, controller 120 (and mitigation control 123, in particular) may randomly or pseudo-randomly select, from a pool of activates (e.g., pool of N activates transmitted between another two consecutive MOP commands), a second row address associated with one of the activates in the pool and randomly select a second victim level (i.e., number of intervening rows from that row address that is to be refreshed), where the second row address and the second victim level is to be transmitted in association with a second MOP command. The random selection of the row may have been made such that each of the pool of activates has a substantially equal (or equal) probability of being selected to provide the row address. Similarly, the random selection of the victim level, may be made such that the probability of selecting victim rows adjacent to the selected row is highest and tapers off inversely with row distance (i.e., number of intervening rows).

To a memory device, a first number of row activate (ACT) commands are transmitted between a first MOP command and a second MOP command that are consecutively transmitted MOP commands, the first MOP command associated with the first MOP row address and the first MOP objective indicator, the second MOP command associated with the second MOP row address and the second MOP objective indicator (706). For example, controller 120 may transmit, to memory device 110 and via CA interface 121 and CA interface 111, a first MOP command in association with the first row address and the first victim level. Controller 120 may then transmit, to memory device 110 and via CA interface 121 and CA interface 111, a number (e.g., N=32) of ACT commands followed by a second MOP command in association with the second row address and the second victim level.

Figure 8:
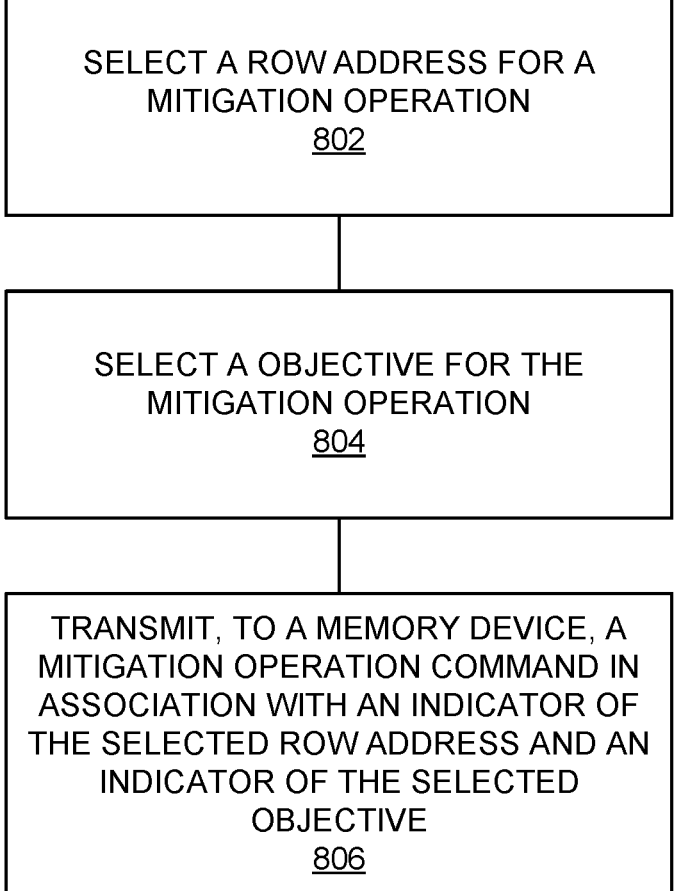
FIG. 8 is a flowchart illustrating a method of issuing row hammer mitigation operation commands.

FIG. 8 is a flowchart illustrating a method of issuing row hammer mitigation operation commands. One or more steps illustrated in FIG. 8 may be performed by, for example, memory system 100, and/or its components. A row address for a mitigation operation is selected (802). For example, controller 120 (and mitigation control 123, in particular) may randomly or pseudo-randomly select, from a pool of activates (e.g., pool of N activates transmitted between two previously transmitted consecutive MOP commands), a row address associated with one of the activates in the pool that is to be transmitted in association with an upcoming mitigation operation command. The random selection of the row may have been made such that each of the pool of activates has a substantially equal (or equal) probability of being selected to provide the row address.

An objective is selected for the mitigation operation (804). For example, controller 120 (and mitigation control 123, in particular) may randomly or pseudo-randomly select a victim level (i.e., number of intervening rows from a suspected aggressor row address that is to be refreshed). The random selection of the victim level, may be made such that the probability of selecting victim rows adjacent to the selected row is highest and tapers off inversely with row distance (i.e., number of intervening rows).

To a memory device, a mitigation operation command is transmitted in association with an indicator of the selected row address and an indicator of the selected objective (806). For example, memory controller 120 may transmit, to memory device 110 and via CA interface 121 and CA interface 111, a MOP command in association with the row address and the victim level.

FIG. 9 is a flowchart illustrating a method of operating a memory device. One or more steps illustrated in FIG. 8 may be performed by, for example, memory system 100, and/or its components. A first mitigation operation command is received in association with a first mitigation operation row address and a first mitigation operation target indicator (902). For example, memory device 110 may receive, from memory controller 120 and via CA interface 121 and CA interface 111, a first MOP command in association with a first suspected aggressor row address and a first victim level.

Based on the first mitigation operation command, the first mitigation operation row address, and the first mitigation operation target indicator, a first row corresponding to the first mitigation operation row address and first mitigation operation target indicator is refreshed (904). For example, based on the first MOP command, the first suspected aggressor row address, and the first victim level, memory device 110 may refresh a row having the victim level number of rows (e.g., adjacent to, one intervening row, two intervening rows, etc.) between the row and the row addressed by the first suspected aggressor row address.

A second mitigation operation command is received in association with a second mitigation operation row address and a second mitigation operation target indicator (906). For example, memory device 110 may receive, from memory controller 120 and via CA interface 121 and CA interface 111, a second MOP command in association with a second suspected aggressor row address and a second victim level. Based on the second mitigation operation command, the second mitigation operation row address, and the second mitigation operation target indicator, a second row corresponding to the second mitigation operation row address and second mitigation operation target indicator is refreshed (908). For example, based on the second MOP command, the second suspected aggressor row address, and the second victim level, memory device 110 may refresh a row having the victim level number of rows (e.g., adjacent to, one intervening row, two intervening rows, etc.) between the row and the row addressed by the second suspected aggressor row address.

FIG. 10 is a flowchart illustrating a method of responding to row hammer mitigation commands. One or more steps illustrated in FIG. 10 may be performed by, for example, memory system 100, and/or its components. A first mitigation operation command is received in association with a first mitigation operation row address and a first mitigation operation target indicator (1002). For example, memory device 110 may receive, from memory controller 120 and via CA interface 121 and CA interface 111, a first MOP command in association with a first suspected aggressor row address and a first victim level.

Based on the first mitigation operation command, the first mitigation operation row address, and the first mitigation operation target indicator, a first row corresponding to the first mitigation operation row address and first mitigation operation target indicator is refreshed (1004). For example, based on the first MOP command, the first suspected aggressor row address, and the first victim level, memory device 110 may refresh a row immediately next to the row addressed by the first suspected aggressor row address. A second mitigation operation command is received in association with a second mitigation operation row address and a second mitigation operation target indicator (1006). For example, memory device 110 may receive, from memory controller 120 and via CA interface 121 and CA interface 111, a second MOP command in association with a second suspected aggressor row address and a second victim level.

Based on the second mitigation operation command, the second mitigation operation row address, and the second mitigation operation target indicator, refresh a second row that has at least one intervening row between a third row that is addressed by the second mitigation operation row address and the second row (1008). For example, based on the second MOP command, the second suspected aggressor row address, and the second victim level, memory device 110 may refresh a row having at least one intervening row between itself and the row addressed by the second suspected aggressor row address.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, and its components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 11:
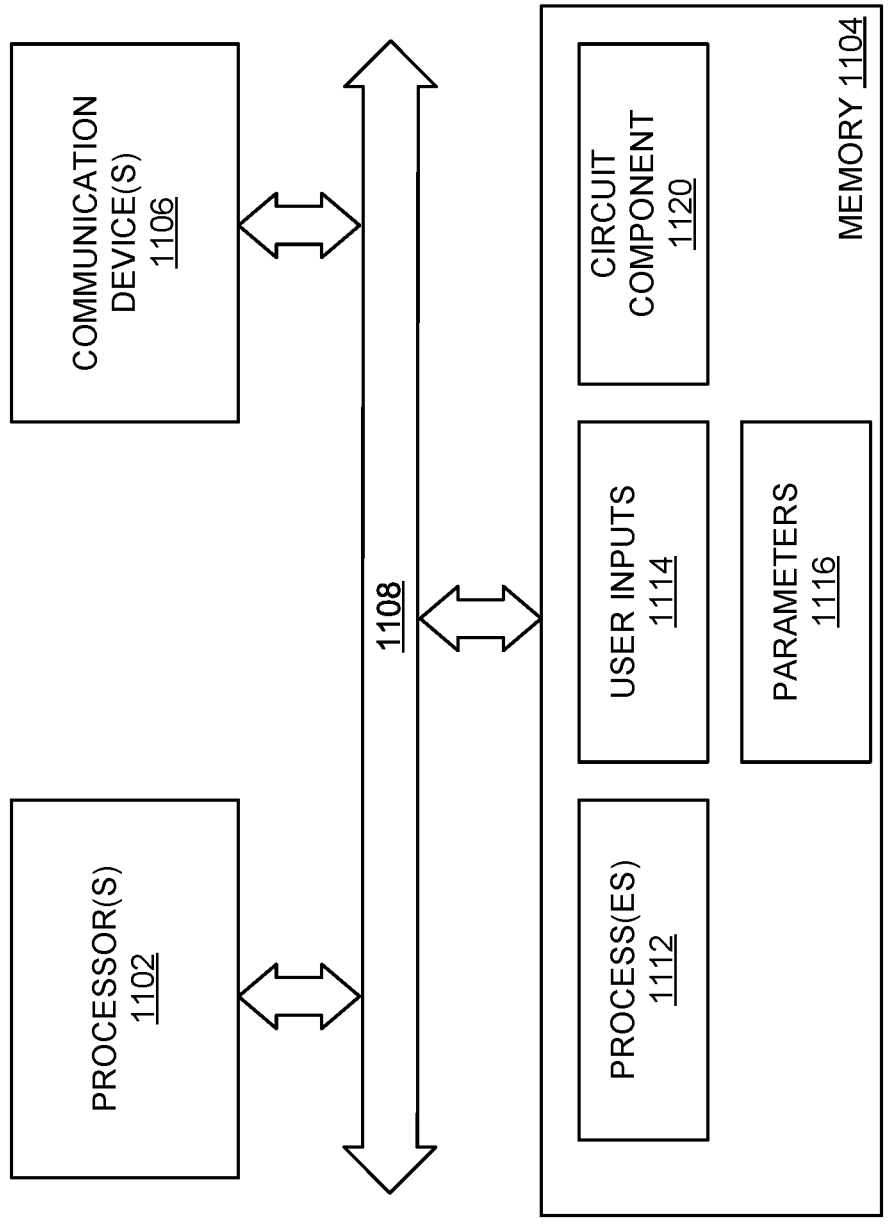
FIG. 11 is a block diagram illustrating a processing system.

FIG. 11 is a block diagram illustrating one embodiment of a processing system 1100 for including, processing, or generating, a representation of a circuit component 1120. Processing system 1100 includes one or more processors 1102, a memory 1104, and one or more communications devices 1106. Processors 1102, memory 1104, and communications devices 1106 communicate using any suitable type, number, and/or configuration of wired and/or wireless connections 1108.

Processors 1102 execute instructions of one or more processes 1112 stored in a memory 1104 to process and/or generate circuit component 1120 responsive to user inputs 1114 and parameters 1116. Processes 1112 may be any suitable electronic design automation (EDA) tool or portion thereof used to design, simulate, analyze, and/or verify electronic circuitry and/or generate photomasks for electronic circuitry. Representation 1120 includes data that describes all or portions of memory system 100 and its components, as shown in the Figures.

Representation 1120 may include one or more of behavioral, register transfer, logic component, transistor, and layout geometry-level descriptions. Moreover, representation 1120 may be stored on storage media or communicated by carrier waves.

Data formats in which representation 1120 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1114 may comprise input parameters from a keyboard, mouse, voice recognition interface, microphone and speakers, graphical display, touch screen, or other type of user interface device. This user interface may be distributed among multiple interface devices. Parameters 1116 may include specifications and/or characteristics that are input to help define representation 1120. For example, parameters 1116 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1104 includes any suitable type, number, and/or configuration of non-transitory computer-readable storage media that stores processes 1112, user inputs 1114, parameters 1116, and circuit component 1120.

Communications devices 1106 include any suitable type, number, and/or configuration of wired and/or wireless devices that transmit information from processing system 1100 to another processing or storage system (not shown) and/or receive information from another processing or storage system (not shown). For example, communications devices 1106 may transmit circuit component 1120 to another system. Communications devices 1106 may receive processes 1112, user inputs 1114, parameters 1116, and/or circuit component 1120 and cause processes 1112, user inputs 1114, parameters 1116, and/or circuit component 1120 to be stored in memory 1104.

Implementations discussed herein include, but are not limited to, the following examples:

Example 1: A memory controller, comprising: a command interface to transmit, to a memory device, row activate (ACT) commands, mitigation operation (MOP) commands, mitigation operation row addresses, and mitigation operation objective indicator; and control circuitry to select mitigation operation row addresses and associated mitigation operation objective indicators that are to be transmitted via the command interface, wherein rows to be refreshed by the memory device in response to the MOP commands are to be based on the mitigation operation row addresses and associated mitigation operation objective indicators.

Example 2: The memory controller of example 1, wherein the control circuitry determines a first number of row activate commands to be transmitted between a first mitigation operation command and a second mitigation operation command.

Example 3: The memory controller of example 2, wherein the first mitigation operation command is associated with a first mitigation operation row address and a first mitigation operation objective indicator, and the second mitigation operation command is associated with a second mitigation operation row address and a second mitigation operation objective indicator.

Example 4: The memory controller of example 3, wherein the control circuitry is to select a first row address from a first plurality of row addresses transmitted in association with a first plurality of row activate commands transmitted by the memory controller between the first mitigation operation command and the second mitigation operation command and is to select a first mitigation operation row address based on the first row address.

Example 5: The memory controller of example 4, wherein the control circuitry is to select a first mitigation operation objective indicator.

Example 6: The memory controller of example 5, wherein an average frequency of selection of the first mitigation operation objective indicator is based on the first number.

Example 7: The memory controller of example 6, wherein the selection of the first mitigation operation objective indicator is based at least in part on a value having random properties.

Example 8: A memory controller, comprising: a command interface to transmit, to a memory device, a first number of row activate (ACT) commands between a first pair of consecutive mitigation operation (MOP) commands, the first pair of consecutive MOP commands consisting of a first MOP command and a second MOP command, the first MOP command associated with a first MOP row address and a first MOP objective indicator, the second MOP command associated with a second MOP row address and a second MOP objective indicator; and control circuitry to select the first MOP row address, the first MOP objective indicator, the second MOP row address, and the second MOP objective indicator.

Example 9: The memory controller of example 8, further comprising: circuitry to configure the first number.

Example 10: The memory controller of example 8, wherein the control circuitry selects a third MOP row address based on a row address associated with at least one of the first number of ACT commands.

Example 11: The memory controller of example 10, wherein the third MOP row address is used as the second MOP row address.

Example 12: The memory controller of example 11, wherein the control circuitry randomly selects the third MOP row address from row addresses associated the first number of ACT commands.

Example 13: The memory controller of example 8, wherein the first number is equal to N and the control circuitry selects, on average, a first value for the second MOP objective indicator with a first probability of (N−1)/N and on average, selects a second value for the second MOP objective indicator with a second probability of 1/N.

Example 14: The memory controller of example 8, wherein the first number is equal to N and the control circuitry selects over a course of transmitting N number of mitigation operation commands, a first value for the second MOP objective indicator (N−1) times and selects a second value for the second MOP objective indicator one time.

Example 15: The memory controller of example 13, wherein the first value is to instruct the memory device to refresh rows immediately adjacent to rows addressed by respective MOP row addresses, and the second value is to instruct the memory device to refresh rows not immediately adjacent to rows addressed by respective MOP row addresses.

Example 16: A method of operating a memory device, comprising: selecting a first mitigation operation (MOP) row address and a first MOP objective indicator; selecting a second MOP row address and a second MOP objective indicator; and transmitting, to a memory device, a first number of row activate (ACT) commands between a first MOP command and a second MOP command that are consecutively transmitted MOP commands, the first MOP command associated with the first MOP row address and the first MOP objective indicator, the second MOP command associated with the second MOP row address and the second MOP objective indicator.

Example 17: The method of example 16, further comprising: selecting a third MOP row address based on a row address associated with at least one of the first number of ACT commands.

Example 18: The method of example 17, wherein the third MOP row address is randomly selected from row addresses associated the first number of ACT commands.

Example 19: The method of example 16, wherein the first number is equal to N and, on average, a first value is selected for the second MOP objective indicator with a first probability of (N−1)/N and on average, a second value is selected for the second MOP objective indicator with a second probability of 1/N.

Example 20: The method of example 16, wherein the first number is equal to N and over a plurality of courses of transmitting N number of mitigation operation commands, a first value for the second MOP objective indicator is selected (N−1) times and a second value for the second MOP objective indicator is selected one time.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller, comprising:
a command interface to transmit, to an external memory device, row activate (ACT) commands, mitigation operation (MOP) commands in association with external mitigation operation row addresses and mitigation operation objective indicators; and
control circuitry to select mitigation operation row addresses and associated mitigation operation objective indicators that are to be transmitted via the command interface, wherein rows to be refreshed by the memory device in response to the MOP commands are to be based on the mitigation operation row addresses and associated mitigation operation objective indicators.

2. The memory controller of claim 1, wherein the control circuitry determines a first number of row activate commands to be transmitted between a first mitigation operation command and a second mitigation operation command.

3. The memory controller of claim 2, wherein the first mitigation operation command is associated with a first external mitigation operation row address and a first mitigation operation objective indicator, and the second mitigation operation command is associated with a second external mitigation operation row address and a second mitigation operation objective indicator.

4. The memory controller of claim 3, wherein the control circuitry is to select a first row address from a first plurality of row addresses transmitted in association with a first plurality of row activate commands transmitted by the memory controller between the first mitigation operation command and the second mitigation operation command and is to select a first mitigation operation row address based on the first row address.

5. The memory controller of claim 4, wherein the control circuitry is to select a first mitigation operation objective indicator.

6. The memory controller of claim 5, wherein an average frequency of selection of the first mitigation operation objective indicator is based on the first number.

7. The memory controller of claim 6, wherein the selection of the first mitigation operation objective indicator is based at least in part on a value having random properties.

8. A memory controller, comprising:
a command interface to transmit, to an external memory device, a first number of row activate (ACT) commands between a first pair of consecutive mitigation operation (MOP) commands, the first pair of consecutive MOP commands consisting of a first MOP command and a second MOP command, the first MOP command to be transmitted in association with a first external MOP row address and a first MOP objective indicator, the second MOP command to be transmitted in association with a second external MOP row address and a second MOP objective indicator; and

17

18 control circuitry to select the first external MOP row address, the first MOP objective indicator, the second external MOP row address, and the second MOP objective indicator.

9. The memory controller of claim 8, further comprising: circuitry to configure the first number.

10. The memory controller of claim 8, wherein the control circuitry selects a third external MOP row address based on a row address associated with at least one of the first number of ACT commands.

11. The memory controller of claim 10, wherein the third external MOP row address is used as the second external MOP row address.

12. The memory controller of claim 11, wherein the control circuitry randomly selects the third external MOP row address from row addresses associated the first number of ACT commands.

13. The memory controller of claim 8, wherein the first number is equal to N and the control circuitry selects, on average, a first value for the second MOP objective indicator with a first probability of (N−1)/N and on average, selects a second value for the second MOP objective indicator with a second probability of 1/N.

14. The memory controller of claim 8, wherein the first number is equal to N and the control circuitry selects over a course of transmitting N number of mitigation operation commands, a first value for the second MOP objective indicator (N−1) times and selects a second value for the second MOP objective indicator one time.

15. The memory controller of claim 13, wherein the first value is to instruct the memory device to refresh rows immediately adjacent to rows addressed by respective external MOP row addresses, and the second value is to instruct the memory device to refresh rows not immediately adjacent to rows addressed by respective external MOP row addresses.

16. A method of operating an external memory device, comprising:

selecting a first external mitigation operation (MOP) row address and a first MOP objective indicator;

selecting a second external MOP row address and a second MOP objective indicator; and transmitting, to the external memory device, a first number of row activate (ACT) commands between a first MOP command and a second MOP command that are consecutively transmitted MOP commands, the first MOP command transmitted in association with the first external MOP row address and the first MOP objective indicator, the second MOP command transmitted in association with the second external MOP row address and the second MOP objective indicator.

17. The method of claim 16, further comprising:

selecting a third external MOP row address based on a row address associated with at least one of the first number of ACT commands.

18. The method of claim 17, wherein the third external MOP row address is randomly selected from row addresses associated the first number of ACT commands.

19. The method of claim 16, wherein the first number is equal to N and, on average, a first value is selected for the second MOP objective indicator with a first probability of (N−1)/N and on average, a second value is selected for the second MOP objective indicator with a second probability of 1/N.

20. The method of claim 16, wherein the first number is equal to N and over a plurality of courses of transmitting N number of mitigation operation commands, a first value for the second MOP objective indicator is selected (N−1) times and a second value for the second MOP objective indicator is selected one time.

* * * * *